(12) United States Patent
Hershtig

(10) Patent No.: US 9,660,608 B2
(45) Date of Patent: *May 23, 2017

(54) LOW PASSIVE INTER-MODULATION CAPACITOR

(71) Applicant: K&L Microwave, Inc., Salisbury, MD (US)

(72) Inventor: Rafi Hershtig, Salisbury, MD (US)

(73) Assignee: K & L Microwave, Inc., Salisbury, MD (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/279,845

(22) Filed: May 16, 2014

(65) Prior Publication Data

US 2014/0247535 A1 Sep. 4, 2014

Related U.S. Application Data

(63) Continuation of application No. 13/049,343, filed on Mar. 16, 2011, now Pat. No. 8,742,869.

(60) Provisional application No. 61/314,391, filed on Mar. 16, 2010.

(51) Int. Cl.
| | |
|---|---|
| *H03H 7/46* | (2006.01) |
| *H01G 4/00* | (2006.01) |
| *H03H 7/01* | (2006.01) |
| *H01G 4/02* | (2006.01) |
| *H01G 7/00* | (2006.01) |
| *H05K 1/18* | (2006.01) |
| *H03H 1/00* | (2006.01) |

(52) U.S. Cl.
CPC ............... *H03H 7/46* (2013.01); *H01G 4/00* (2013.01); *H01G 4/02* (2013.01); *H01G 7/00* (2013.01); *H03H 7/0115* (2013.01); *H05K 1/181* (2013.01); *H03H 2001/0014* (2013.01); *Y10T 29/417* (2015.01); *Y10T 29/43* (2015.01)

(58) Field of Classification Search
CPC . H01G 4/02; H01G 4/30; H01L 28/40; H03H 7/46; H03H 7/0115
USPC ......... 361/326, 301.1, 763, 821, 309, 301.3; 333/24 C, 185, 132, 175
See application file for complete search history.

(56) References Cited

U.S. PATENT DOCUMENTS

| | | | | |
|---|---|---|---|---|
| 2,751,558 | A * | 6/1956 | Engelmann | H01P 1/02 333/204 |
| 3,093,805 | A * | 6/1963 | Osifchin | H01P 3/006 174/117 R |
| 3,240,602 | A | 3/1966 | Johnston | |

(Continued)

OTHER PUBLICATIONS

L.I. Berger, Dielectric Strength of Insulating Materials, CRC Press, 2000.

*Primary Examiner* — Stephen E Jones
*Assistant Examiner* — Rakesh Patel
(74) *Attorney, Agent, or Firm* — Banner & Witcoff, Ltd.

(57) ABSTRACT

A high power, low passive inter-modulation capacitor is presented, which is formed using metal clad substrates, which are broad-side coupled through a thin air gap. Each substrate may include metal layers affixed on both sides which are electrical coupled together to form a single capacitor plate, or each substrate may have only a single metal layer on the surface adjacent to the air gap. The capacitor has particular application in low cost RF and microwave filters, which may be used in communication equipment and communication test equipment such a diplexers, for low PIM applications.

14 Claims, 9 Drawing Sheets

(56) References Cited

U.S. PATENT DOCUMENTS

| | | | |
|---|---|---|---|
| 4,464,702 A * | 8/1984 | Miller | H01G 4/38 |
| | | | 361/328 |
| 4,940,955 A | 7/1990 | Higgins, Jr. | |
| 4,987,391 A | 1/1991 | Kusiak, Jr. | |
| 7,233,218 B2 | 6/2007 | Park et al. | |
| 8,742,869 B2 * | 6/2014 | Hershtig | 333/132 |
| 2003/0095371 A1 * | 5/2003 | Cheung | H01G 4/02 |
| | | | 361/326 |
| 2006/0164186 A1 * | 7/2006 | Stoemmer et al. | 333/189 |
| 2009/0058556 A1 | 3/2009 | Niiranen et al. | |
| 2009/0284947 A1 * | 11/2009 | Beddingfield | H01L 23/49833 |
| | | | 361/818 |

* cited by examiner

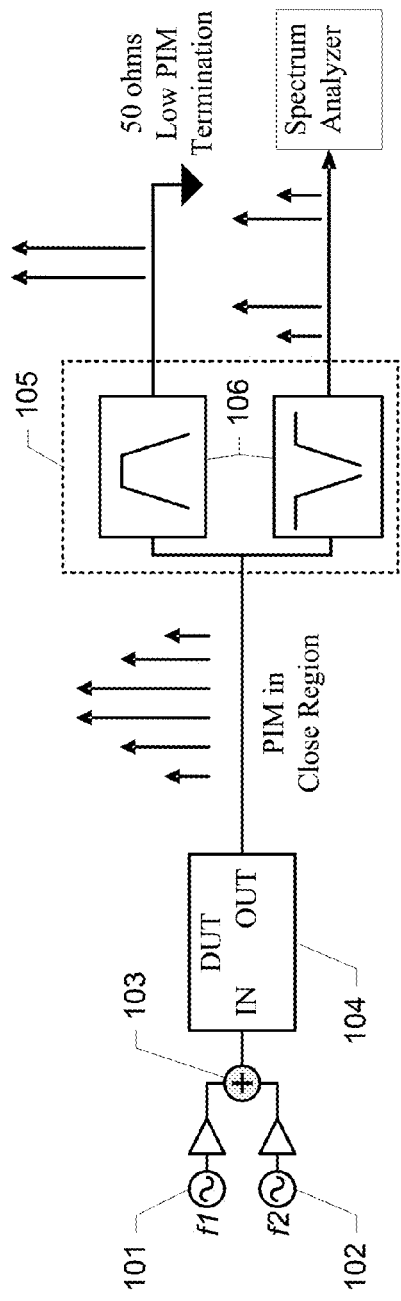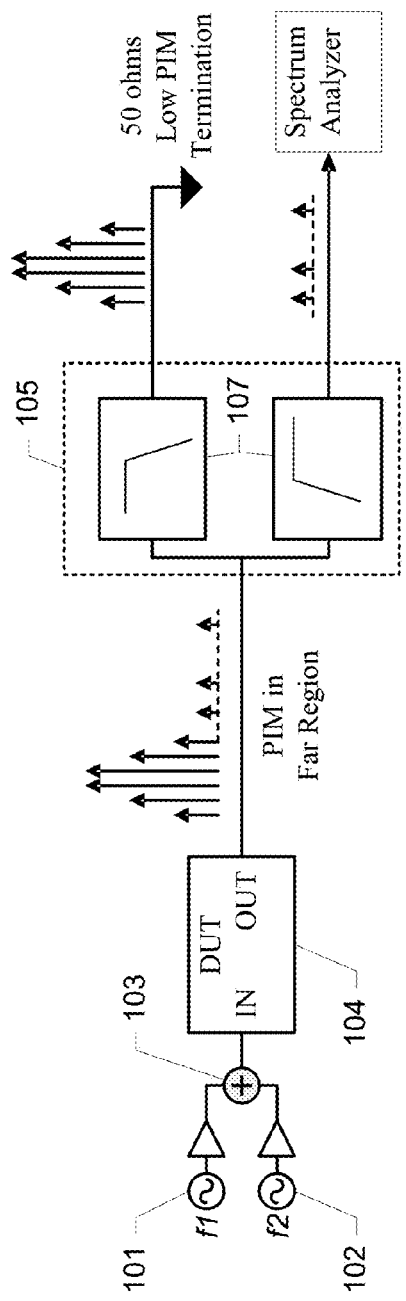

LOW PASSIVE INTER-MODULATION CAPACITOR

This application is a continuation of U.S. patent application Ser. No. 13/049,343 filed Mar. 16, 2011, which claims the benefit of U.S. provisional application Ser. No. 61/314,391, filed Mar. 16, 2010, the disclosures of which is hereby incorporated in its entirety.

FIELD OF THE INVENTION

The invention relates generally to high power, low passive inter-modulation (PIM) capacitors having an air gap dielectric, and more particularly to filters using such capacitors for creating extremely low PIM filters.

BACKGROUND OF THE INVENTION

Products with low Inter-Modulation Distortion (IMD) characteristics are becoming increasingly important factor in wireless communication links. In cellular communication base stations for example, two or more carriers may share the same antennas, amplifiers, filters, etc., where non-linearity in the components may cause mixing of the carriers to produce unwanted spurious signals that interfere with the operation of the system. Inter-modulation caused from passive components, i.e., Passive Inter-modulation (PIM), is one problematic source of IMD in communication systems. Previously known PIM sources include diodes, ferromagnetic materials in conductors and connectors, junctions between galvanically dissimilar metals, and junctions between metals and oxides that exhibit diode-like behavior.

An example of a 0.5 W cell phone communicating with a base-station illustrates the significance PIM can have in cellular communications. The signal from the cell phone may be as low as −110 dBm when received. Often a two-tone model is used for the carrier frequencies, with each tone at 20 W, or +43 dBm. This amounts to extracting the cell phone signal at −153 dBc below the carrier frequencies. Thus, any PIM noise caused by the carriers must be below a −153 dBm noise floor to avoid adverse effects on the system.

In filter design, the PIM requirements may be even more extreme. To guarantee that base-stations are deployed to comply with the stringiest PIM specifications, special filter solutions are needed for use in the components of the base-station, as well as in the test equipment used to develop, install, and calibrate those components. For example, in test set filters used for broad emission monitoring, an additional −3 dBm of margin resulting in a −156 dBm PIM requirement may be needed to guarantee that the test filters are not injecting noise into a device under test (DUT) that would provide misleading results.

SUMMARY OF THE INVENTION

Band-pass/Band-stop diplexers and High-pass/Low-pass diplexers are illustrative communication equipment used in communication systems and test systems that incorporate filters requiring low PIM performance. Transverse electromagnetic (TEM) cavity structures and suspended-substrate strip-line (SSS) structures are often utilized in such applications. SSS technology has the particular advantage of having a relatively simple structure for realizing a series capacitor incorporated into the filters. Unfortunately, SSS structures used to realize broad-band coupling through the PWB suffer from poor PIM noise performance, a phenomena which to the best of the Inventor's knowledge, has not been covered in the literature or well understood by the telecommunications industry in the design of diplexers and filters.

Regardless of the type of material, the substrate (e.g., printed wiring board) on which SSS capacitors are formed contributes significantly to the poor PIM performance of the SSS filters. One cause for the poor performance may be the dispersion of different dielectric constants of the media making up the substrate (e.g., epoxies, insulators, air, etc). Such substrates tend to exhibit strong non-linear properties, which might give rise to IM products.

In order to overcome the problems with the prior filters, various novel embodiments are presented which include filters featuring high power broadside coupled capacitor utilizing an air dielectric layer.

In a first embodiment, a broadside coupled capacitor, which exhibits low PIM performance is realized with metal clad substrates forming plates of the capacitor having planar surfaces separated by an air dielectric. Each substrate may have metal clad on both sides of the substrate conductively connected. In other embodiments, the substrates may have metal clad on only one side and be disposed with the metal facing each other through an air gap. In a third embodiment, the broadside-coupled capacitor may be disposed in a metal enclosure and electrically connected with other elements to form a filter through an air gap.

The above and other objects, features and advantages of the present invention will be readily apparent and fully understood from the following detailed description of embodiments, taken in connection with the appended drawings.

BRIEF DESCRIPTION OF THE DRAWINGS

FIGS. 1A and 1B show test configurations in which various embodiments may be used.

DETAILED DESCRIPTION OF THE INVENTION

Figure 2:
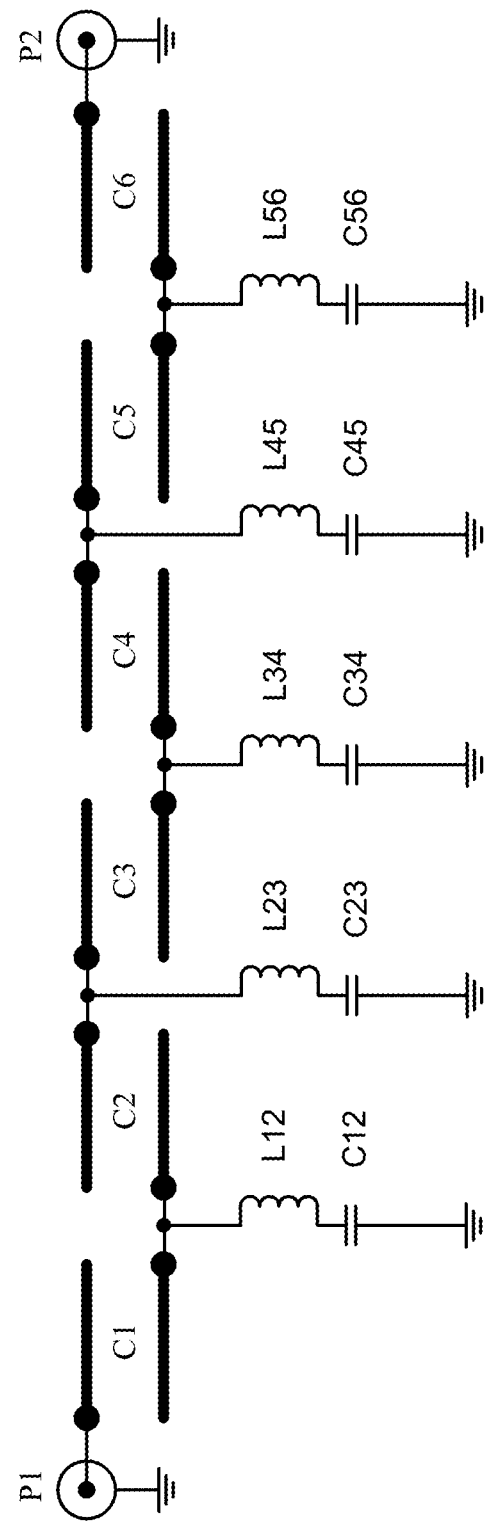
FIG. 2 shows a schematic diagram of a filter.

FIG. 1A illustrates a typical test setup for measuring inter-modulation distortion (IMD) performance of electronic equipment used in telecommunication systems. In the test setup two signals sources, 101 and 102, at different frequencies, f1 and f2, are amplified to a specified power, summed together through a coupler 103, and driven into a device under test (DUT) 104. The frequency of the two source signals will depend on the application in which the DUT is used. As one example, for base station applications, the frequencies equal to the TX and RX carrier signals may be used. The output of DUT 104 is connected to the common port of diplexer 105, which separates the IMD products generated by the DUT from the source carrier signals and from other signal generated by the DUT. The separated IMD signals are then fed to a spectrum analyzer for measurement.

The diplexer may include a band-pass/band-stop diplexer 106 as in FIG. 1A, or a high-pass/low-pass diplexer 107 as in FIG. 1B, or some combination of the two types of diplexers depending on the frequency range of interest. For example, to measure the close region of the Tx band of a base station, the band-pass/band-stop diplexer may be used. In one illustrative application of testing communication equipment used in base stations, the test is often performed according to IEC standard 62037, which specifies a source signal power of 20 W, or 43 dBm. The diplexers used in such a test must therefore be rated to handle the carrier power. In other illustrative applications, the diplexer's power rating can be designed accordingly to the specific application.

The challenge in building the filters for broadband emission monitoring such as those used in the diplexers of FIGS. 1A and 1B is that the filters themselves need to be free of PIM to avoid injecting IMD which is not from the DUT. For testing cellular base station equipment, a dynamic range as low as −153 dBc may be required, which dictates that the test filters be free of PIM down to −156 dBc. This provides at least −3 dBc of margin. Of course, the PIM requirement will depend on the application and signal levels being measured.

The technology for building high power wide band filters often includes Transverse Electromagnetic (TEM) cavity structures and suspended-substrate strip-line (SSS) structures. SSS technology has the particular advantage of having a relatively simple structure for realizing a series capacitor incorporated into the filters. Unfortunately, SSS structures suffer from poor PIM noise performance, a phenomena which has not been covered in the literature or well understood by the telecommunications industry in the design of diplexers and filters.

During the design of the present embodiments disclosed herein, it has been discovered that the substrate (e.g., printed wiring boards) on which a SSS capacitor is formed contributes significantly to poor PIM performance. One cause for the poor performance may be the dispersion due to different dielectric constants of the media making up the substrate (e.g., epoxies, insulators, air, etc.). Such substrates having different dielectric constants tend to exhibit strong non-linear properties.

In order to overcome the problems with the prior filters, various novel embodiments are presented which incorporate filters featuring high power broadside coupled capacitors utilizing an air dielectric layer. This new structure maintains the low manufacturing cost and repeatability of SSS structures, but does not suffer from the non-linear behavior. One embodiment of a solution to this problem is to plate both sides of the printed wiring board with copper and use plated through holes to couple the copper sides together. Two of these plates may be disposed in close proximity.

Figure 3:
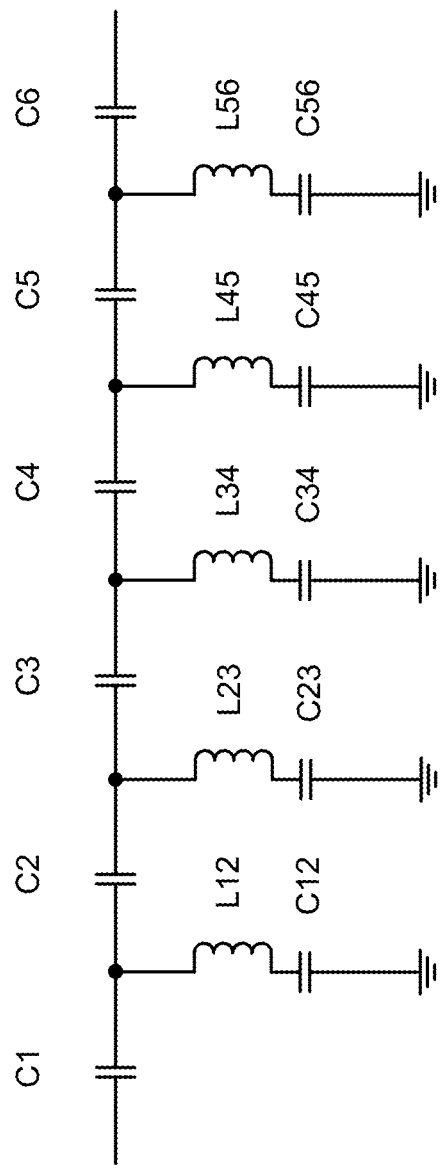
FIG. 3 shows an alternate schematic diagram of a filter.

FIG. 2 shows a schematic diagram of an illustrative high pass filter that may be used in a diplexer. As shown in FIG. 2, the filter consists of six series capacitors C1-C6 connected between an input P1 and output P2. C1-C6 are high power broadside coupled capacitors with air gap dielectrics. The capacitors are drawn in FIG. 2 with the terminals connected in a parallel orientation to the plates to represent the physical orientation of the actual capacitors as implemented in the embodiment shown in FIG. 4. Each intermediate node between series capacitors C1-C6 is coupled through a shunt LC circuit (L12, C12 to L56, C56) to ground. FIG. 3 illustrates an alternate electrically equivalent circuit of the same filter.

Figure 4:
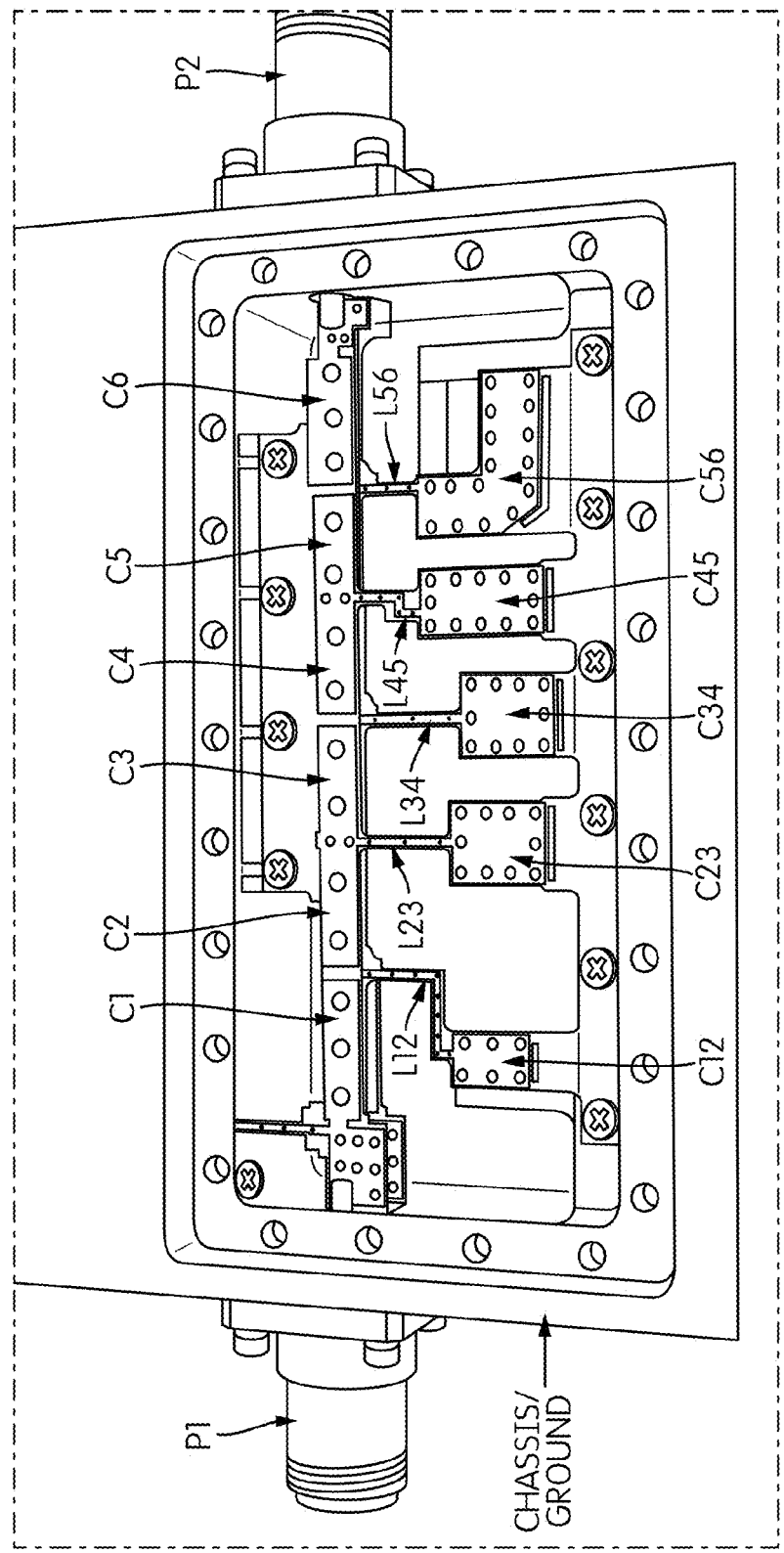
FIG. 4 shows a perspective view of the filter of FIG. 2 including the broadside filter.

FIG. 4 shows an illustrative embodiment of the filter represented in FIGS. 2 and 3 within a diplexer assembly. The filter is housed in an enclosure, shown with the lid removed, which may form a faraday cage when completely assembled. The enclosure is labeled Chassis/Ground in FIG. 4, which may act as the neutral or ground point for the filter. On the left side of the diplexer, the common port P1 is mechanically mounted with the outer shell of the connecter electrical connected to the chassis, and the center conductor of the P1 perforating the left wall of the enclosure through an insulated through hole. Just inside of the wall, the center conductor or P1 is soldered to a metallic trace formed from a top metal layer or a substrate. The top substrate runs horizontally across the width of the inside of the enclosure to the center conductor of output port P2. The center conductor of P2 is soldered to a metallic trace of the top substrate on the inside of the right wall. P2 is mounted and electrically connected to the right wall of the enclosure in the same manner as P1.

Disposed along the top substrate is a metal layer forming the top plates of capacitors C1-C6. A bottom metal clad substrate is mounted underneath the top substrate to form the bottom plates of capacitors C1-C6. A thin air-gap is maintained between the substrates to form the capacitor dielectric. The air gap is illustrated in FIG. 5, which shows a different perspective of the same embodiment shown in FIG. 4.

Figure 5:
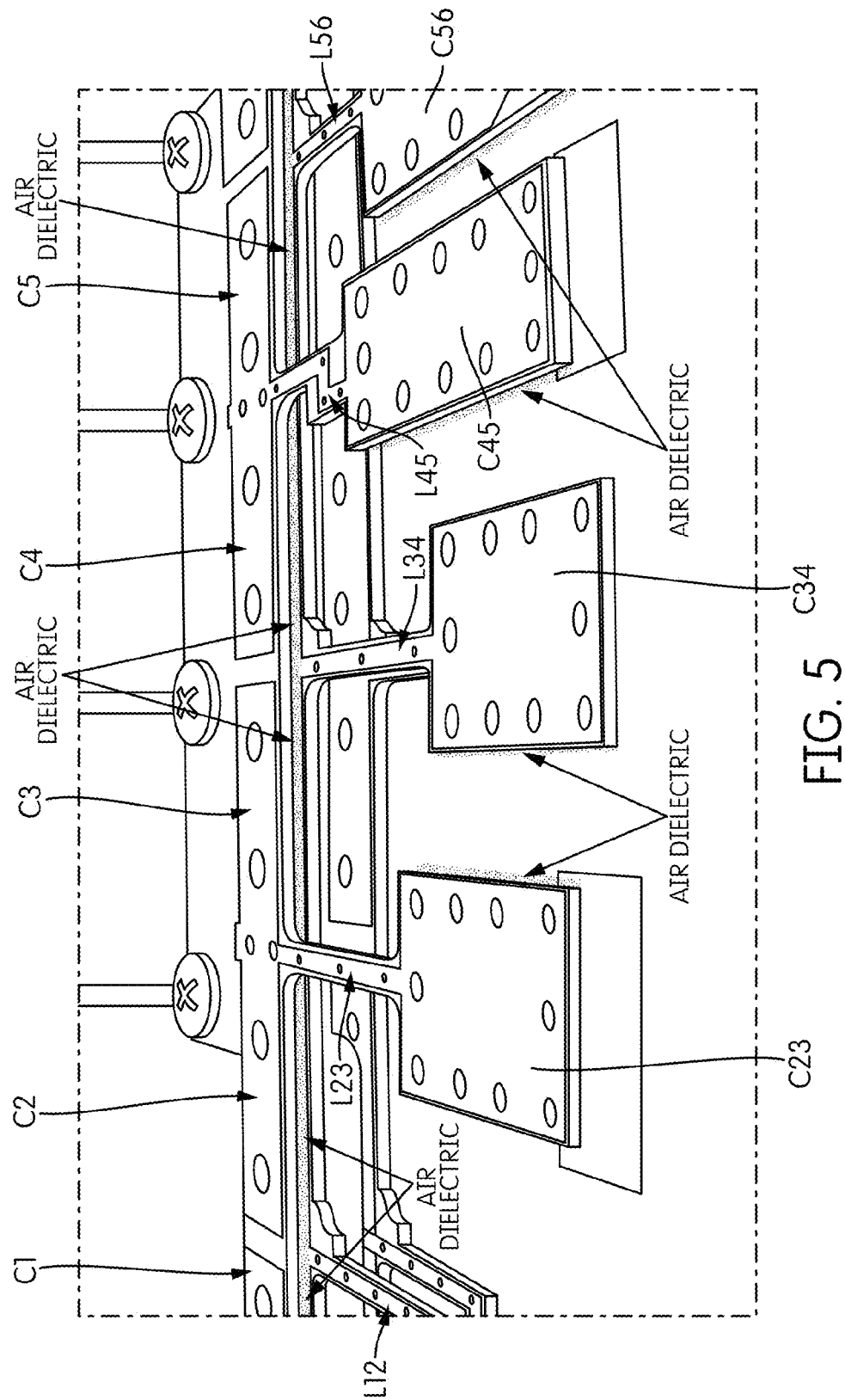
FIG. 5 shows a perspective view of the filter of FIG. 2 including an alternate broadside filter.
Figure 6:
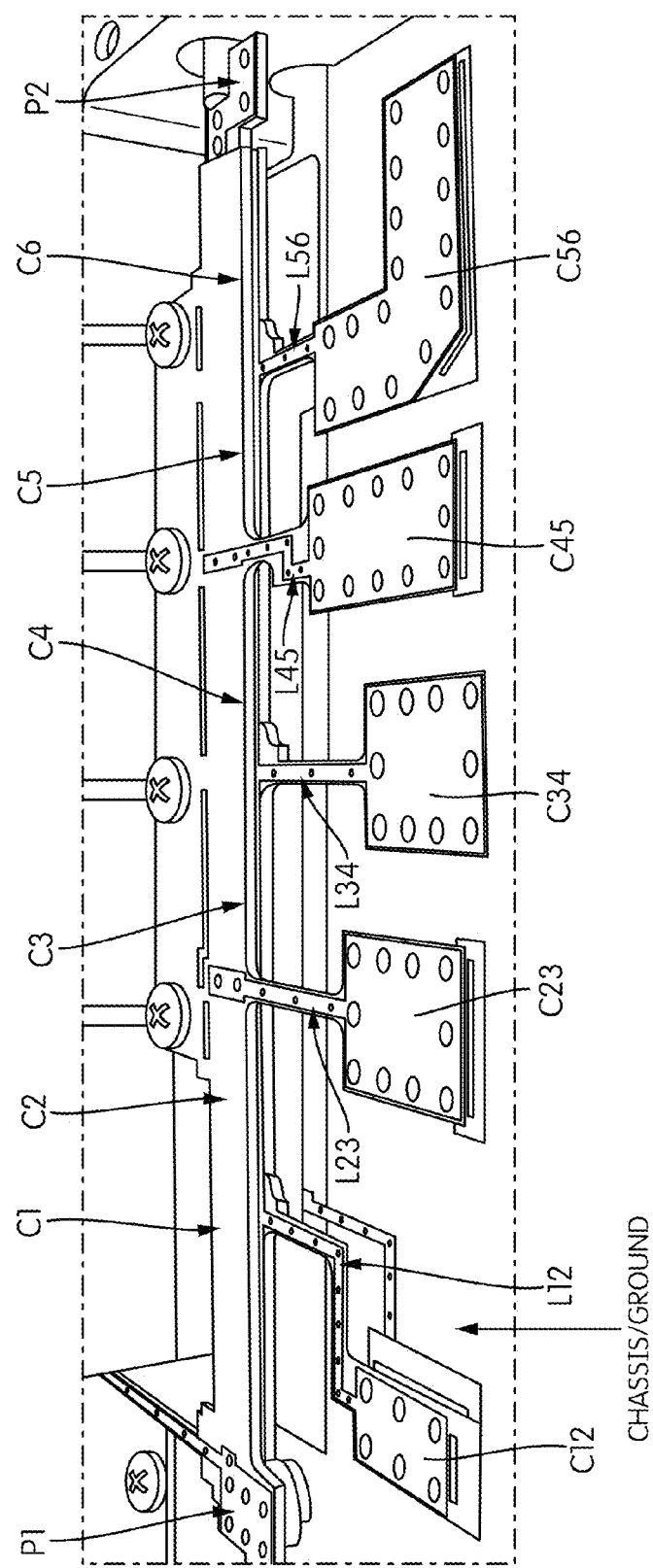
FIG. 6 shows a perspective view of the filter of FIG. 2.

The substrates in FIGS. 4 and 5 may be plated with metal on both the bottom and top surfaces, which are electrically connected using several plated through holes. Employing metal on both surfaces of the substrate reduces the overall current density in the metal layers. In an alternate configuration of the same circuit shown in FIG. 6, the metal layer is only maintained on one surface of each substrate, which is adjacent to the air gap between the substrates. Having a single metal layer provides other advantages such as, in certain configurations, better PIM performance at higher frequencies.

To connect the capacitors in series, a strip of metal layer between each adjacent capacitor plate on the substrate is either removed or left in place to connect or isolate the adjacent capacitor respectively. For example, the metal on the top substrate is removed between the top plates of C1 and C2 while the metal on the top substrate between the top plates of C2 and C3 is left remaining to join C2 and C3 as a continuous strip. This geometric relationship is notionally shown in the configuration of C1-C6 in the schematic in FIG. 2.

Also shown in FIGS. 4 and 5 are the inductors L12, L23, L34, L45, and L56 and capacitors C12, C23, C34, C45, and C56 forming the shunt LC circuits. The shunt inductors are formed by thin narrow strips of metal formed with a metal layer of the substrate, representing high impedance lines. Each inductor has a different length and dimension to provide different values of inductance. The shunt capacitors are formed with a wide top plate, representing low impedance lines, constructed in the same manner as the plates of C1-C6, and the bottom plate constructed from a planar surface of the metal enclosure or another substrate having metal plating. The dielectric for the shunt capacitors may be air as in the C1-C6, or may be some other material such as another substrate.

In operation, the signal energy in the pass frequency region propagates in the center conductor of P1 to the top plate of C1, through the air gap to the bottom plate of C1 and C2, back through the air gap to the top plate of C2 and C3, back through the air gap to the bottom plate of C3 and C4, back through the air gap to the top plate of C4 and C5, back through the air gap to the bottom plate of C5 and C6, back through the air gap to the top plate of C6 and finally to the center conductor of P2. Unwanted frequency components below the cut-off are either blocked by C1-C6 or shorted to ground through the shunt LC circuits before the unwanted frequencies reach P2.

The top and bottom substrates may be formed from typical printed wiring board material, such a FR4, Kevlar polyimide, ceramic, etc., and the metal clad, or metal film layer may be any number of conductive metals including copper, aluminum, etc. To improve PIM performance, non-magnetic, non-plated metals are preferred. Because the filter structure is formed using standard printed wiring board technology, tight tolerances can be maintained while keeping the cost of manufacturing low. The electrical capacitive and inductive properties of the L and C components can be precisely controlled and customized from filter to filter by changing the dimensions of the substrate metals, the distances maintained between the two substrates, and the distances maintained between the substrates and the enclosure.

Figure 7:
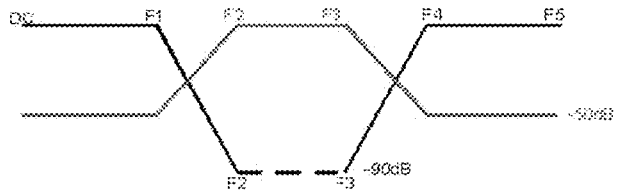
FIGS. 7-8 illustrate typical frequency response parameters achieved with filters in accordance with the present invention.
Figure 8:
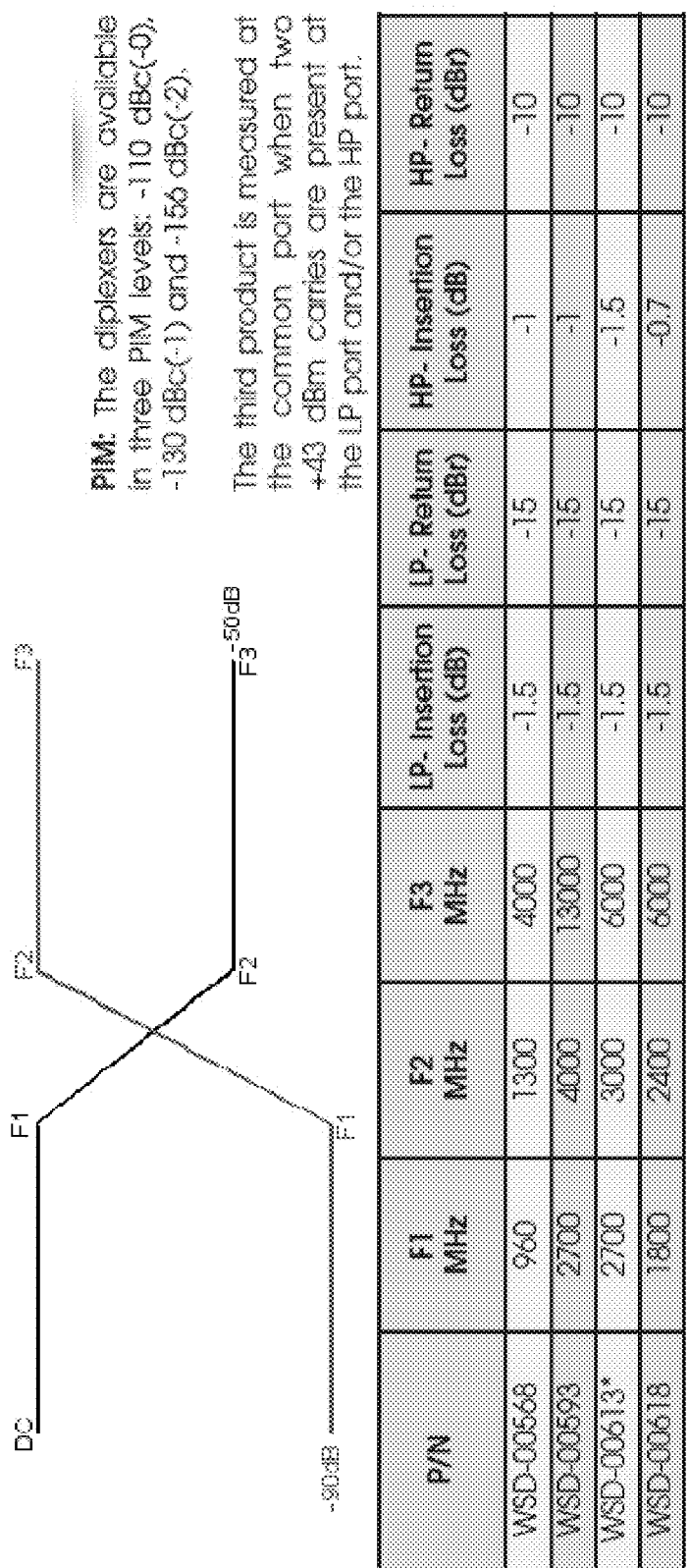

FIGS. 7 and 8 illustrate typical frequency response parameters achieved by filters employing the present invention.

Figure 9:
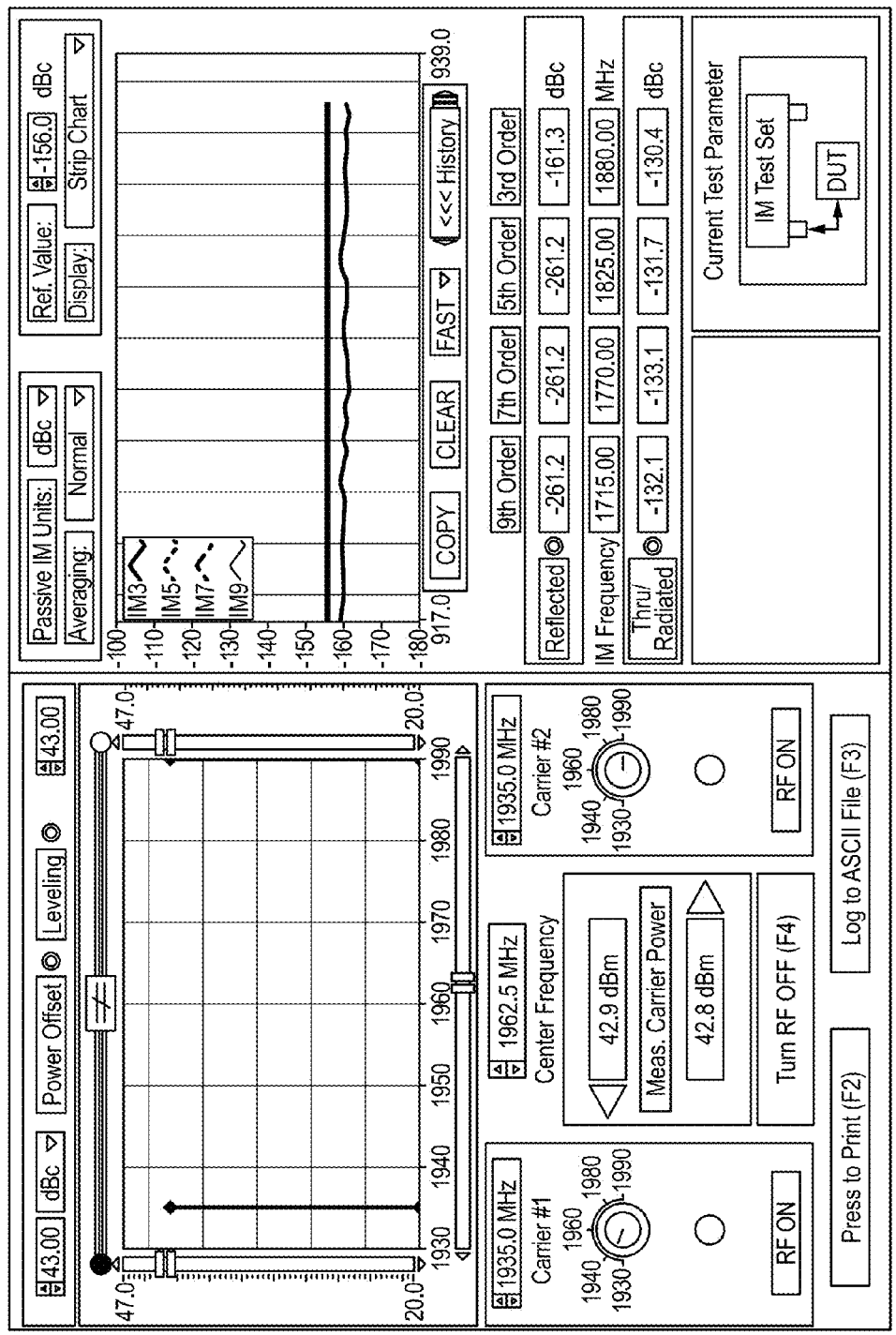
FIG. 9 shows the PIM test results of a illustrative High-Pass Filter embodiment for two +43 dBm tones at 1935 and 1990 MHz.

FIG. 9 shows the PIM test results of an illustrative High-Pass Filter embodiment for two +43 dBm tones at 1935 and 1990 MHz.

While the invention has been described with respect to specific examples including presently preferred modes of carrying out the invention, those skilled in the art will appreciate that there are numerous variations and permutations of the above-described systems and techniques that fall within the spirit and scope of the invention as set forth in the appended claims. For example, the broadside-coupled capacitor structures with an air gap described and illustrated herein, may be used to implement any combination of filters 106 and 107 as discussed with respect to FIGS. 1A and 1B.

The invention claimed is:

1. An apparatus comprising:
   one or more capacitors formed by a pair of metal clad printed wiring boards broadside capacitively coupled through an air dielectric gap; and
   a metal enclosure forming a faraday cage enclosing the one or more capacitors, wherein one or both of the pair of metal clad printed wiring boards are broadside capacitively coupled to one or more surfaces of the metal enclosure through one or more additional air dielectric gaps to form one or more additional capacitors.

2. The apparatus of claim 1, wherein metal on one or both of the pair of metal clad printed wiring boards form one or more inductors connecting the one or more capacitors to the one or more additional capacitors.

3. An electrical circuit comprising:
   a first capacitor comprising:
      a first terminal comprising a first metal layer affixed to a substrate, and
      a second terminal formed by a metal enclosure within which the substrate is mounted,
      wherein the first terminal and the second terminal are broadside capacitively coupled through an air dielectric gap, and
      wherein the first metal layer is affixed to a first planar surface of the substrate and the metal enclosure comprises a second planar surface, the first planar surface of the substrate and second planar surface being parallel and separated by the air dielectric gap; and
   a second capacitor comprising a third terminal and a fourth terminal, wherein the substrate includes a second metal layer affixed to the first planar surface of the substrate or a third planar surface of the substrate, the second metal layer forming the third terminal.

4. The electrical circuit of claim 3, wherein the substrate comprises a metal clad printed wiring board.

5. The electrical circuit of claim 4, wherein the metal clad printed wiring board comprises a non-magnetic non-plated metal clad printed wiring board.

6. The electrical circuit of claim 3, wherein the substrate includes a connecting metal layer affixed to either the first planar surface or the second planar surface, the connecting metal layer connecting the first metal layer and the second metal layer.

7. The electrical circuit of claim 6, wherein the connecting metal layer forms an inductor.

8. A diplexer including the electrical circuit of claim 3.

9. A method comprising:
   mounting, within a metal enclosure, a first metal clad printed wiring board and a second metal clad printed wiring board in a broad-side orientation separated by an air dielectric gap to form one or more first capacitors, a first metal on a first planar surface of the first metal clad printed wiring board forming one or more first terminals of the one or more first capacitors, and a second metal on a second planar surface of the second metal clad printed wiring board forming one or more second terminals of the one or more first capacitors,
   wherein the first metal clad printed wiring board and the second metal clad printed wiring board are mounted in the metal enclosure such that one or more third terminals of one or more second capacitors are formed by a third metal on the second planar surface or on a third planar surface on the second metal clad printed wiring board, the one or more third terminals of the one or more second capacitors being separated by one or more other air dielectric gaps from one or more surfaces of the metal enclosure, which form one or more fourth terminals of the one or more second capacitors.

10. The method of claim 9, the first metal clad printed wiring board and the second metal clad printed wiring board having metal formed as inductors connecting the one or more first terminals and the one or more second terminals to the one or more third terminals.

11. A method comprising:
   mounting, within a metal enclosure, a first metal clad printed wiring board and a second metal clad printed wiring board in a broad-side orientation separated by an air dielectric gap to form a first one or more capacitors and a second one or more capacitors,
   wherein a first metal on a first planar surface of the first metal clad printed wiring board forms one or more first terminals of the first one or more capacitors, and a second metal on a second planar surface of the second metal clad printed wiring board forms one or more second terminals of the first one or more capacitors, and
   wherein one or more surfaces of the metal enclosure form one or more terminals of the second one or more capacitors.

12. The method of claim 11, wherein strips of the first metal and the second metal connect one or more adjacent plates of the first one or more capacitors.

13. An electrical circuit comprising a capacitor disposed within a metal enclosure and having a passive intermodulation distortion of less than −156 dBc in response to inputs of two +43 dBm signals having first and second frequencies respectively above 1900 MHz, wherein the capacitor comprises metal layers affixed to a pair of substrates, the metal layers broadside capacitively coupled through an air dielectric gap.

14. A capacitor comprising metal layers affixed to a pair of substrates, the metal layers broadside capacitively coupled through an air dielectric gap,
wherein a first substrate of the pair of substrates comprises a first metal layer of the metal layers affixed to a first planar surface, which forms a first terminal of the capacitor,
wherein a second substrate of the pair of substrates comprises:
a second metal layer of the metal layers affixed to a second planar surface, which forms a second terminal of the capacitor;
a third metal layer of the metal layers affixed to a third planar surface; and
metal through holes conductively coupling the second metal layer and the third metal layer; and
wherein the first planar surface and second planar surface are parallel and separated by the air dielectric gap.

\* \* \* \* \*